United States Patent
Tate et al.

(10) Patent No.: US 10,998,920 B1
(45) Date of Patent: May 4, 2021

(54) OVERCOMING SATURATED SYNDROME CONDITION IN ESTIMATING NUMBER OF READOUT ERRORS

(71) Applicant: Apple Inc., Cupertino, CA (US)

(72) Inventors: Yonathan Tate, Kfar Saba (IL); Eli Yazovitsky, Netanya (IL); Michael Tsohar, Givat Shmuel (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/801,249

(22) Filed: Feb. 26, 2020

(51) Int. Cl.
| | |
|---|---|
| *H03M 13/15* | (2006.01) |
| *H03M 13/39* | (2006.01) |
| *H03M 13/11* | (2006.01) |
| *G11C 29/44* | (2006.01) |
| *H03M 13/43* | (2006.01) |
| *G06F 11/07* | (2006.01) |
| *G11C 29/42* | (2006.01) |

(52) U.S. Cl.
CPC ......... *H03M 13/159* (2013.01); *G06F 11/076* (2013.01); *G11C 29/42* (2013.01); *G11C 29/44* (2013.01); *H03M 13/1108* (2013.01); *H03M 13/1111* (2013.01); *H03M 13/3927* (2013.01); *H03M 13/43* (2013.01)

(58) Field of Classification Search
CPC .................................................. H03M 13/159
USPC .................................. 714/785, 784, 787, 788
See application file for complete search history.

(56) References Cited

U.S. PATENT DOCUMENTS

| | | | |
|---|---|---|---|
| 8,745,468 B1 | 6/2014 | Zhang et al. | |
| 8,880,987 B2 | 11/2014 | Sharon et al. | |
| 9,176,815 B2 | 11/2015 | Chen et al. | |
| 9,697,075 B2 | 7/2017 | Tate et al. | |
| 10,002,086 B1 | 6/2018 | Achtenberg et al. | |
| 10,276,247 B2 | 4/2019 | Alhussien et al. | |
| 10,388,394 B2 | 8/2019 | Tate et al. | |
| 2012/0163084 A1* | 6/2012 | Franca-Neto | G11C 16/3495 365/185.18 |

(Continued)

OTHER PUBLICATIONS

Design of a smart non-volatile memory controller: Architecture modeling, systems analysis, parallel I/O processing and scheduling algorithms Jung, Myoungsoo. ProQuest Dissertations and Theses ProQuest Dissertations Publishing. (2013) (Year: 2013).*

*Primary Examiner* — Fritz Alphonse
(74) *Attorney, Agent, or Firm* — Kligler & Associates Patent Attorneys Ltd

(57) ABSTRACT

A controller includes an interface and circuitry. The interface is coupled to multiple memory cells. The circuitry stores a code word in a group of the memory cells, reads the code word using different thresholds to produce first and second readouts, and checks whether approximating each of first and second numbers of readout errors based on syndrome weights is valid. In response to determining that only the approximation of the second number of errors is valid, the circuitry produces a combined readout by replacing a portion of the bits in the second readout with corresponding bits of the first readout, calculates an enhanced syndrome weight for the combined readout and estimates the first number of errors based on the enhanced syndrome weight. The circuitry improves readout performance from at least the group of the memory cells using at least one of the estimated first and second numbers of errors.

20 Claims, 6 Drawing Sheets

(56) References Cited

U.S. PATENT DOCUMENTS

| | | | |
|---|---|---|---|
| 2012/0166707 A1* | 6/2012 | Franca-Neto | G11C 29/50 |
| | | | 711/103 |
| 2012/0166897 A1* | 6/2012 | Franca-Neto | G11C 29/50 |
| | | | 714/721 |
| 2014/0313832 A1* | 10/2014 | Meir | G11C 16/0483 |
| | | | 365/185.17 |
| 2017/0236592 A1 | 8/2017 | Alhussien et al. | |
| 2017/0269991 A1 | 9/2017 | Bazarsky et al. | |
| 2019/0035485 A1* | 1/2019 | Tate | G11C 29/42 |

* cited by examiner

US 10,998,920 B1

OVERCOMING SATURATED SYNDROME CONDITION IN ESTIMATING NUMBER OF READOUT ERRORS

TECHNICAL FIELD

Embodiments described herein relate generally to data storage, and particularly to methods and systems for overcoming saturated syndrome condition in estimating number of readout errors.

BACKGROUND

Data read from a nonvolatile memory may contain errors due to various reasons such as misposition of read thresholds, drifting of threshold voltage distributions, aging, and the like. Methods for evaluating and improving the readout performance of a nonvolatile memory are known in the art. For example, U.S. Patent Application Publication 2017/0236592 describes a syndrome weight of failed decoding attempts that is used to select parameters for future read retry operations. The following exemplary steps are performed until a decoding success or a predefined limited number of readings is reached: (i) reading a codeword using different read threshold voltages; (ii) mapping the readings to a corresponding likelihood value using a likelihood value assignment; and (iii) recording a syndrome weight for failed decoding attempts of the readings using the different read threshold voltages. Once the predefined limit is reached, the following exemplary steps are performed: (i) mapping the readings to a corresponding likelihood value using different likelihood value assignments, and (ii) recording a syndrome weight for failed decoding attempts of the readings using the different likelihood value assignments; and using a given read threshold voltage and/or a likelihood value assignment associated with a substantially minimum syndrome weight as an initial read threshold voltage and/or a higher priority read threshold voltage for subsequent read retry operations.

U.S. Pat. No. 10,388,394 describes a memory system that includes an interface and storage circuitry. The interface is configured to communicate with a plurality of memory cells that store data by setting the memory cells to analog voltages representative of respective storage values. The storage circuitry is configured to read from a group of the memory cells a code word encoded using an Error Correction Code (ECC), by sensing the memory cells using at least first and second read thresholds for producing respective first and second readouts, to calculate, based on at least one of the first and second readouts, (i) a syndrome weight that is indicative of an actual number of errors contained in the code word, and (ii) a mid-zone count of the memory cells for which the first readout differs from the second readout, and, to evaluate a performance measure for the memory cells, based on the calculated syndrome weight and mid-zone count.

SUMMARY

An embodiment that is described herein provides a controller that includes an interface and storage circuitry. The interface is coupled to a nonvolatile memory device including multiple memory cells. The storage circuitry is configured to store a code word produced with an Error Correction Code (ECC), in a group of the memory cells, by setting the memory cells in the group to analog levels representative of respective storage values, to read the code word from the group of the memory cells, by comparing the analog levels of the memory cells to first and second read thresholds to produce respective first and second readouts, to check whether approximating each of first and second numbers of errors in the first and second readouts, based on calculating respective first and second syndrome weights, is valid or not, in response to determining that approximation of the first number of errors is invalid, but that the approximation of the second number of errors is valid, to produce a combined readout by replacing a portion of the bits in the second readout with corresponding bits of the first readout, to calculate an enhanced syndrome weight for the combined readout and estimate the first number of errors based on the enhanced syndrome weight, and, to improve readout performance from at least the group of the memory cells using at least one of the estimated first number of errors and the second number of errors.

In some embodiments, the storage circuitry is configured to check whether an estimation of the first number of errors based on the combined readout is valid or not, and in response to determining that the estimation is invalid, to produce another combined readout by replacing another portion of the bits in the second readout with corresponding bits of the first readout, calculating another enhanced syndrome weight for the another combined readout and estimating the first number of errors based on the another enhanced syndrome weight. In other embodiments, the storage circuitry is configured to produce multiple combined readouts by replacing respective portions of the bits in the second readout with corresponding bits of the first readout, calculating multiple respective enhanced syndrome weights for the combined readouts, and estimating the first number of errors based on the multiple enhanced syndrome weights. In yet other embodiments, the storage circuitry is configured to calculate multiple numbers of errors from the multiple enhanced syndrome weights, and to calculate the first number of errors by calculating an average number of errors among the multiple numbers of errors.

In an embodiment, the storage circuitry is configured to calculate, based on the estimated first number of errors and on the second number of errors, a number $N0$ of bits having a logical zero-value and a number $N1$ of bits having a logical one-value in a range of threshold voltages between the first and second read thresholds, and to improve the readout performance based on the calculated values of $N0$ and $N1$. In another embodiment, the storage circuitry is configured to improve the readout performance by calculating a Log Likelihood Ratio (LLR) as $LLR=Log(N0/N1)$, and applying soft decoding to the code word based on the first and second readouts by assigning the calculated LLR to memory cells sensed between the first and second read thresholds. In yet another embodiment, the storage circuitry is configured to improve the readout performance by tracking a channel matrix calculated based on at least $N0$ and $N1$ for a zone between the first and second read thresholds.

In some embodiments, the storage circuitry is configured to improve the readout performance by positioning an optimal read threshold based on three or more readouts in respective three or more different read thresholds, the readouts contain respective three or more numbers of errors, including the first and second read thresholds, and the first and second numbers of errors. In other embodiments, the storage circuitry is configured to improve the readout performance by deciding whether to decode the code word, and in case of decoding, to further decide whether to decode the code word using hard decoding or soft decoding. In yet other embodiments, the storage circuitry is configured to calculate the approximation of the first number of errors by mapping a syndrome weight of the first readout to the approximation of the first number of errors, and to decide that the approximation of the first number of errors is invalid when the approximation of the first number of errors exceeds a predefined threshold number.

There is additionally provided, in accordance with an embodiment that is described herein, a method for data storage, including, in a controller coupled to a nonvolatile memory device including multiple memory cells, storing a code word produced with an Error Correction Code (ECC), in a group of the memory cells, by setting the memory cells in the group to analog levels representative of respective storage values. The code word is read from the group of the memory cells, by comparing the analog levels of the memory cells to first and second read thresholds to produce respective first and second readouts. A checking is made of whether approximating each of first and second numbers of errors in the first and second readouts, based on calculating respective first and second syndrome weights, is valid or not. In response to determining that approximation of the first number of errors is invalid, but that the approximation of the second number of errors is valid, a combined readout is produced by replacing a portion of the bits in the second readout with corresponding bits of the first readout, an enhanced syndrome weight is calculated for the combined readout and the first number of errors is estimated based on the enhanced syndrome weight. Readout performance from at least the group of the memory cells is improved using at least one of the estimated first number of errors and the second number of errors.

These and other embodiments will be more fully understood from the following detailed description of the embodiments thereof, taken together with the drawings in which:

DETAILED DESCRIPTION OF EMBODIMENTS

Overview

Figure 1:
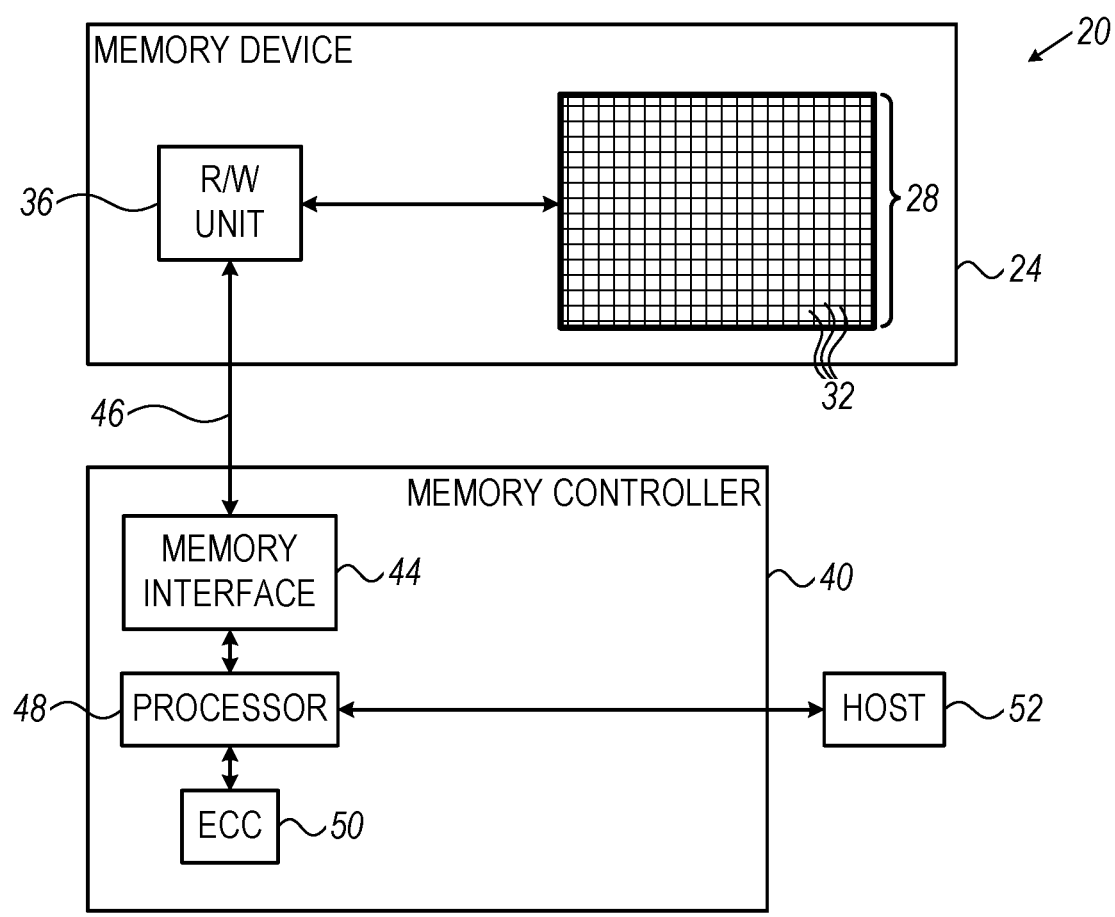
FIG. 1 is a block diagram that schematically illustrates a memory system, in accordance with an embodiment that is described herein.

Embodiments that are described herein provide methods and systems for overcoming a condition of a saturated syndrome used in estimating number of readout errors.

A storage system typically comprises a controller coupled to a nonvolatile memory device comprising multiple memory cells. In some embodiments, the controller applies storage operations to a group of memory cells in the memory device using a suitable storage circuitry. For enhanced reliability, the controller may store data in an encoded form, by applying to the data a suitable Error Correction Code (ECC) such as, for example, a Low-Density Parity-Check (LDPC) code. The encoded data is also referred to as a "code word." The controller stores the code word in a group of the memory cells (e.g., belonging to a common word line), by setting the memory cells in the group to analog levels representative of respective storage values.

To read the code word from memory, the storage circuitry typically sets one or more read thresholds and senses the analog values of the relevant memory cells. A readout produced by reading the code word may contain one or more errors. The code word contains redundancy information that may be used for correcting erroneous bits, by applying to the code word ECC decoding.

The ECC has limited error correction capabilities, e.g., up to a predefined number of errors. Moreover, ECC decoding is typically a complex task in terms of the number of calculations, latency and power consumption. In some embodiments, the controller derives a rough estimation of the number of errors in the code word, e.g., before attempting full ECC decoding. A large estimated number of errors may be indicative of a code word that will fail ECC decoding with high probability. The estimated number of errors in the code word may also be used for improving readout performance as will be described in detail below.

In principle, the controller could make a fast estimation of the number of errors by calculating the syndrome weight of the readout and mapping the syndrome weight to a number of errors using a suitable mapping or function. An estimation of this sort would be valid, however, only when the number of errors in the code word readout is not too high. Otherwise, this approach may produce an invalid estimation of the number of errors.

In some embodiments, the storage circuitry of the controller reads the code word from the group of the memory cells, by comparing the analog levels of the memory cells to different read thresholds denoted TR1 and TR2 to produce respective readouts denoted RD1 and RD2. The storage circuitry checks whether approximating each of the number of errors Ne1 in RD1 and the number of errors Ne2 in RD2, based on mapping respective syndrome weights denoted SW1 and SW2 to the numbers of errors, is valid or not. In response to determining that approximation of Ne1 is invalid, but that the approximation of Ne2 is valid, the storage circuitry produces a combined readout by replacing a portion of the bits RD2 with corresponding bits of the RD1. The storage circuitry calculates an enhanced syndrome weight for the combined readout and estimates Ne1 and Ne2, e.g., by mapping the enhanced syndrome weight to Ne1 and mapping SW2 to Ne2. In some embodiments, the storage circuitry improves readout performance from at least the group of the memory cells using at least one of the estimated numbers of errors Ne1 and Ne2.

In some embodiments, the storage circuitry checks whether an estimation of the first number of errors based on the combined readout is valid or not, and in response to determining that the estimation is invalid, the storage circuitry produces another combined readout by replacing another portion of the bits in the second readout with corresponding bits of the first readout, calculating another enhanced syndrome weight for the another combined readout, and estimating the first number of errors based on the another enhanced syndrome weight. The storage circuitry may attempt multiple different combined readouts until finding a combined readout whose syndrome is unsaturated.

In alternative embodiments, the storage circuitry produces multiple combined readouts by replacing respective portions of the bits in RD2 with corresponding bits of RD1, calculating multiple respective enhanced syndrome weights for the combined readouts, and estimating Ne1 based on the multiple enhanced syndrome weights. For example, the storage circuitry calculates multiple numbers of errors from the multiple enhanced syndrome weights and calculates Ne1 by calculating an average number of errors among the multiple numbers of errors.

In an embodiment, the storage circuitry calculates, based on the estimated Ne1 and Ne2, a number N0 of bits having a logical zero-value and a number N1 of bits having a logical one-value, in a range of threshold voltages between the read thresholds TR1 and TR2 (TR1<TR2), and improves the readout performance based on the calculated values of N0 and N1.

The storage circuitry may improve the readout performance in various ways. In an example embodiment, to improve the readout performance the storage circuitry calculates a Log Likelihood Ratio (LLR) as LLR=Log(N0/N1) for the zone between the read thresholds TR1 and TR2. In some embodiments, the processor uses other suitable methods for estimating LLR values in a zone of threshold voltages below TR1 and in a zone of threshold voltages above TR2, e.g., for soft decoding. In one embodiment, the processor assigns to bits whose memory cells read below TR1 and above TR2 LLR values representing high reliability. To bits of memory cells sensed between TR1 and TR2, the processor assigns the calculated LLR value Log(N0/N1) above. In an embodiment, the processor uses the calculated LLR to apply soft decoding based on RD1, RD2 and the LLR values in the three zones created by TR1 and TR2.

As another example, the storage circuitry improves the readout performance by tracking a channel matrix calculated based on at least N0 and N1 for a zone between TR1 and TR2. Note that for estimating a complete channel matrix that holds N0 and N1 counts per each zone created by TR1 and TR2, the processor is required to estimate N0 and N1 counts below TR1 and above TR2 using any suitable method. In some embodiments, the storage circuitry improves the readout performance by positioning an optimal read threshold based on Ne1 and Ne2. In other embodiments, the storage circuitry improves the readout performance by deciding whether to decode the code word, and in case of decoding, the storage circuitry further decides whether to decode the code word using hard decoding or soft decoding.

In an embodiment, the storage circuitry approximates Ne1 by mapping a syndrome weight of RD1 to Ne1 and decides that the approximated Ne1 is invalid when the approximated Ne1 exceeds a predefined threshold number. A similar calculation applies for deciding whether the estimation of Ne2 for RD2 is valid or not.

In the disclosed techniques, the number of errors in a code word is approximated efficiently even when a readout of that code word has a saturated syndrome. To this end, another readout of the same code word is produced, wherein the syndrome of the other readout is unsaturated. The number of errors in the first readout is estimated from a combined readout that contains bits from both readouts and that is unsaturated. The disclosed techniques enable to improve readout performance based on the number of errors estimated from one or both readouts. Moreover, ECC decoding may be skipped when the estimated number of errors exceeds a predefined number, thus reducing power consumption and latency incurred by the decoding operation.

System Description

FIG. 1 is a block diagram that schematically illustrates a memory system 20, in accordance with an embodiment that is described herein. Memory system 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

Memory system 20 comprises a memory device 24, which stores data in a memory array 28 that comprises multiple memory cells 32, such as analog memory cells. In the context of the present patent application, the term "analog memory cell" is used to describe any memory cell that holds a continuous, analog value of a physical parameter, such as an electrical voltage or charge. Memory array 28 may comprise solid-state memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM) or Resistive RAM (RRAM). Although the embodiments described herein refer mainly to analog memory, the disclosed techniques may also be used with various other memory types.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

Note that in the description that follows, the terms "analog values" and "threshold voltages" are used interchangeably.

Memory system 20 stores data in analog memory cells 32 by programming the memory cells to assume respective memory states, which are also referred to as programming levels. The programming levels are selected from a finite set of possible levels, and each programming level corresponds to a certain nominal storage value. For example, a 2 bit/cell Multi-Level Cell (MLC) can be programmed to assume one of four possible programming levels by writing one of four possible nominal storage values into the cell. Similarly, a 3 bit/cell MLC, also referred to as a Triple-Level Cell (TLC), can be programmed to assume one of eight possible programming levels. A memory cell that stores a single bit (i.e., using two programming levels) is also referred to as a Single-Level Cell (SLC).

Memory device 24 comprises a reading/writing (R/W) module 36, which converts data for storage in the memory device to analog storage values and writes them into memory cells 32. In alternative embodiments, the R/W module does not perform the conversion, but is provided with voltage samples, i.e., with the storage values for storage in the cells. When reading data out of memory array 28, R/W module 36 converts the storage values of memory cells 32 into digital samples having an integer resolution of one or more bits. Data is typically written to and read from the memory cells in data units that are referred to as data pages (or simply pages, for brevity).

For reading a data page, the R/W module typically sets one or more read thresholds, e.g., at about mid-points between adjacent nominal programming levels, and senses the threshold voltages of the memory cells relative to the read thresholds. The R/W module can also read the analog values of the memory cells in selected ranges or zones by setting the read thresholds to zone boundaries.

The storage and retrieval of data in and out of memory device 24 is performed by a memory controller 40. Memory controller 40 comprises a memory interface 44 for communicating with memory device 24, a processor 48, and an Error Correcting Code (ECC) module 50. The memory controller communicates with the memory device via memory interface 44 over a communication link 46. Communication link 46 may comprise any suitable link or communication bus, such as, for example, a PCIe bus. The disclosed techniques can be carried out by memory controller 40, by R/W module 36, or both. Thus, in the present context, memory controller 40 and R/W module 36 are referred to collectively as storage circuitry that carries out the disclosed techniques.

Memory controller 40 communicates with a host 52, for accepting data for storage in the memory device and for outputting data retrieved from the memory device. In some embodiments, ECC module 50 encodes the data for storage using a suitable ECC and decodes the ECC of data retrieved from the memory. ECC module 50 may comprise any suitable type of ECC, such as, for example, Low Density Parity Check (LDPC), Reed-Solomon (RS) or Bose-Chaudhuri-Hocquenghem (BCH), can be used. Note, however, that embodiments that are described below that rely on calculating a syndrome weight refer mainly to codes that can be represented by a set of parity-check equations such as, for example, LDPC codes. Note that a good approximation of the number of errors from the syndrome weight is achieved for codes having a sparse parity-check matrix, such as, for example, LDPC codes.

Data read from a group of memory cells may contain one or more errors. The number of errors typically increases when the read threshold used for sensing the memory cells is positioned non-optimally. In some applications, the ECC supported by ECC module 50 can be represented by multiple parity-check equations.

In an embodiment, a syndrome vector that is indicative of the error pattern is generated by multiplying the readout data vector by the parity-check matrix of the ECC, e.g., using a hardware matrix-by-vector multiplier (not shown). Alternatively, other suitable methods for producing the syndrome vector can also be used. The weight of the syndrome vector, i.e., the number of the non-zero elements in the syndrome vector equals the number of unsatisfied parity-check equations. When the number of errors is relatively small, the syndrome weight is indicative of the number of errors in the code word. For example, for a code word having 4K bytes and assuming the code rate equals 0.9, a valid number of errors may be estimated from the syndrome weight up to about 700 errors or less. In an embodiment, the syndrome vector comprises binary elements, and the syndrome weight is calculated by summing the binary elements having a "1" value.

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example memory system configuration, which is shown purely for the sake of conceptual clarity. Any other suitable memory system configuration can also be used. For example, although the example of FIG. 1 shows a single memory device, in alternative embodiments memory controller 40 may control multiple memory devices 24, e.g., in a RAID storage system. Elements that are not necessary for understanding the principles of the present disclosure, such as various interfaces, addressing circuits, timing and sequencing circuits and debugging circuits, have been omitted from the figure for clarity.

In the example memory system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, processor 48 of memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of memory array 28, memory cells 32 are arranged in multiple rows and columns, and each memory cell comprises a floating-gate transistor. The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

In some embodiments, memory pages are sub-divided into sectors. Data pages may be mapped to word lines in various manners. Each word line may store one or more data pages. A given data page may be stored in all the memory cells of a word line, or in a subset of the memory cells (e.g., the odd-order or even-order memory cells). To access a specific word line or data page, the memory device is provided with a respective physical address.

Erasing of the memory cells in memory array 28 is usually carried out in blocks that contain multiple memory pages. Typical memory devices may comprise thousands of erasure blocks (also referred to as "memory blocks"). In a typical two-dimensional (2D) two-bit-per-cell MLC device, each erasure block is on the order of 128 word lines, each comprising several tens of thousands of memory cells. Two-bit-per-cell devices having 128 word lines per erasure block that store a data page per bit significance value would have 256 data pages per erasure block, and three-bit-per-cell devices would have 394 data pages per block. A typical three-dimensional (3D) device that stores three bits per cell may comprise, for example, 4 sections per block, wherein each section comprises several thousand strings that each comprises 48 layers of cell columns. Such a 3D device has 12 data pages per a physical word line, or 576 data pages per an erasure block. Alternatively, other block sizes and configurations can also be used.

Threshold Voltage Distributions and Related Readouts

Figure 2:
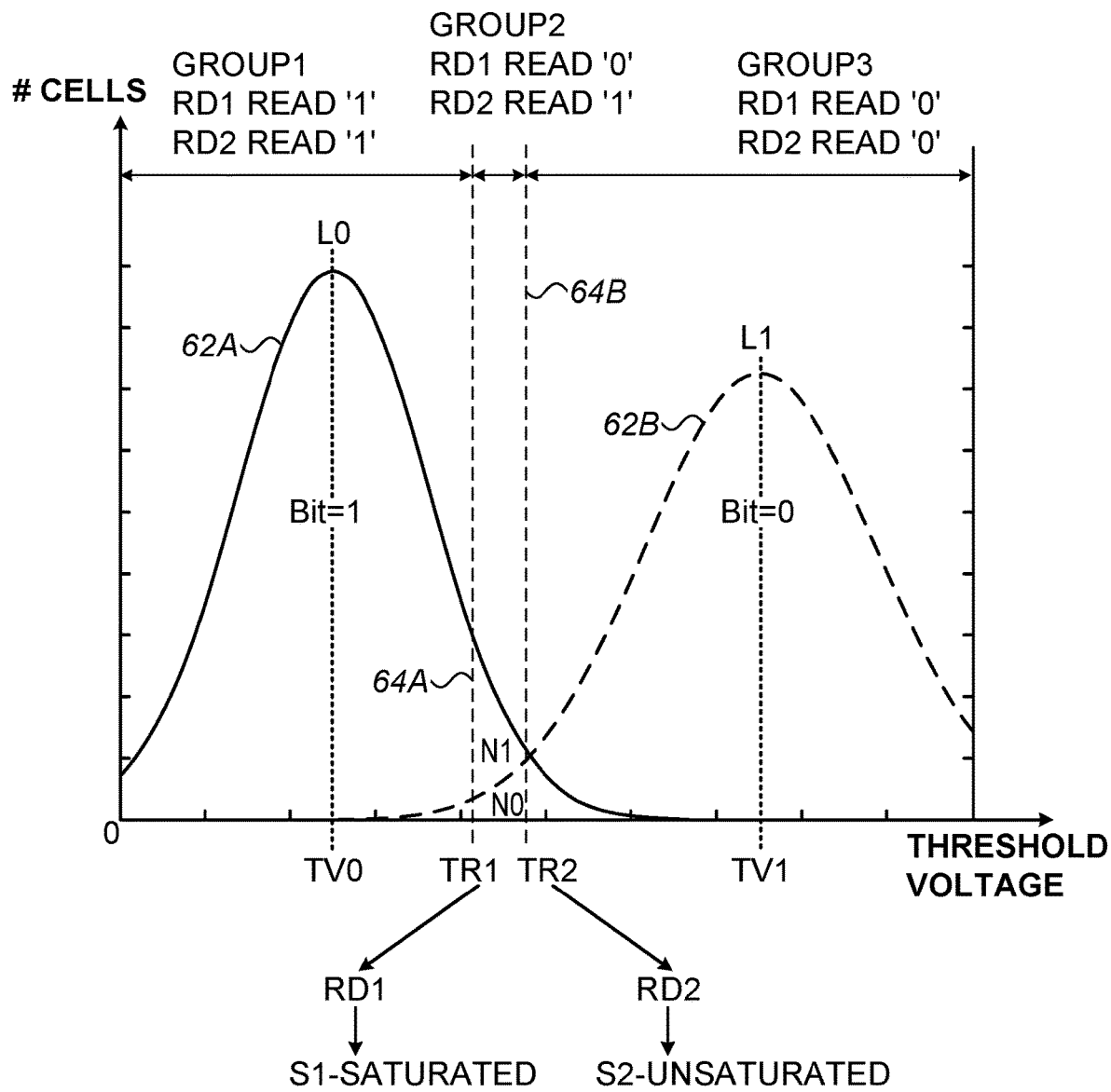
FIG. 2 is a diagram that schematically illustrates threshold voltage distributions in a group of memory cells that are sensed to produce two readouts, one of which having a saturated syndrome, in accordance with an embodiment that is described herein.

FIG. 2 is a diagram that schematically illustrates threshold voltage distributions in a group of memory cells that are sensed to produce two readouts, one of which having a saturated syndrome, in accordance with an embodiment that is described herein.

FIG. 2 depicts threshold voltage distributions 62A and 62B corresponding to respective programming levels L0 and L1. Threshold voltage distributions 62A and 62B are centered about respective nominal threshold voltages TV0 and TV1. The threshold voltage distributions in FIG. 2 may correspond to an erasure level L0 and a first programming level L1 to which memory cells 32 may be programmed. Alternatively, threshold voltage distributions 62A and 62B may correspond to any two adjacent programming levels to which memory cells 32 may be programmed in a multi-level device.

Consider processor 48 reading data from a group of memory cells 32 by sensing the memory cells using two different read thresholds denoted TR1 (64A) and TR2 (64B), producing respective readouts denoted RD1 and RD2. In the present example, read threshold TR2 is close to an optimal read threshold that would have been used in a single threshold reading operation for achieving minimum probability of error. In contrast, read threshold TR1 is positioned well below TR2 and is therefore less optimal than TR1. Consequently, a readout produced using TR1 is expected to contain a larger number of errors than a readout produced using TR2.

In some embodiments, processor reads from the group of the memory cells a code word that was encoded using an ECC, e.g., using ECC module 50. As described above, a syndrome vector for the code word is a vector whose nonzero elements are associated with respective parity-check equations of the ECC that are unsatisfied for the code word. For an ECC having a sparse parity-check matrix, such as a Low-Density Parity-Check (LDPC) code, the number of nonzero elements in the syndrome vector, also referred to as the "syndrome weight," is indicative of the number of errors contained in the code word, when the number of errors is sufficiently small. In the description that follows the term "syndrome vector" is also refer to simply as "syndrome" for brevity.

In the present example, processor 48 reads a code word from the same group of memory cells using two different read thresholds TR1 and TR2 to produce readouts RD1 and RD2, respectively. Both RD1 and RD2 have the same length of the underlying code word. A zero-valued (or one-valued) bit in RD1 corresponds to a memory cell sensed above (or below) TR1. Similarly, A zero-valued (or one-valued) bit in RD2 corresponds to the same memory cell being sensed above (or below) TR2.

The bits of the code word can be classified into three groups denoted GROUP1, GROUP2 and GROUP3 as follows. GROUP1 contains bits that were sensed below TR1 and have a logical value '1' in both RD1 and RD2. GROUP2 contains bits that were sensed above TR1 and below TR2 and have logical values '0' in RD1 and '1' in RD2. GROUP3 contains bits that were sensed above TR2 and have a logical value '0' in both RD1 and RD2. The number of bits corresponding to memory cells that were sensed between TR1 and TR2 (belonging to GROUP2) is denoted "Nc". In some embodiments, processor 48 calculates Nc by counting the number of bits that flip from a zero-value in RD1 to a one-value in RD2.

Let N0 and N1 denote the numbers of bits in GROUP2 having respective logical values '0' and '1'. N0 and N1 correspond to a range of threshold voltages between TR1 and TR2 and an area below threshold distributions L1 and L0. Nc can be expressed as:

$$Nc = N0 + N1 \qquad \text{Equation 1:}$$

In some embodiments, separate values of N0 and N1 are required rather than just their sum Nc. Methods for estimating each of N0 and N1 and using them, e.g., for enhancing decoding performance will be described in detail below.

Let C denote a code word, and let X denote a readout of C containing errors represented by a vector E, so that X=C+E. Given the parity-check matrix H of the underlying ECC, the syndrome S of X is a linear function of X given by S=H·X. For certain error correction codes, such as LDPC codes (or other suitable codes having a sparse parity-check matrix), it can be shown, that at low bit error rates, the syndrome weight W(S) behaves approximately as a linear function of the number of errors W(E), i.e., W(S)=W(H·E) =α·W(E), wherein a is a positive scalar. For example, for a LDPC code in which every bit of the code word C participates in a number dv of parity-check equations (i.e., dv is the variable degree), the syndrome weight can be approximated as:

$$W(S) \cong dv \cdot Ne \qquad \text{Equation 2:}$$

wherein Ne is the total number of errors in E. Given a syndrome weight W(S), the number of errors Ne can be estimated as:

$$Ne \cong W(S)/dv \qquad \text{Equation 3:}$$

In some embodiments, the number of errors Ne may be estimated using an expression known as the inverse Gallager's equation given by:

$$Ne \cong \frac{N}{2}\left[1 - \left(1 - \frac{2 \cdot W(S)}{M}\right)^{1/d}\right] \triangleq f[W(S)] \qquad \text{Equation 4}$$

In Equation 4, N denotes the length of the code word, M denotes the number of parity-check equations of the underlying ECC, and d denotes the check-node degree of the ECC. The check-node degree is the number of bits participating in each of the parity check equations of the ECC.

A syndrome S, for which the approximation for Ne based on the syndrome weight W(S) is invalid because the number of errors is too high, is referred to herein as a "saturated syndrome." Typically, a saturated syndrome has a large weight value.

The syndrome weight W(S') of a saturated syndrome S' typically does not grow linearly with Ne, but remains saturated at an approximate value: W(S')≅length(S')/2. If, for example, the approximation W(S)≅dv·Ne holds up to a maximal number of errors MAX_Ne, the weight of a saturated syndrome S' satisfies W(S')*dv·MAX_Ne≤dv−Ne. In some embodiments, saturation is identified using a weight threshold lower than (dv·MAX_Ne) to ensure correct identification of the linear working zone.

In the example of FIG. 2, a syndrome denoted S1 corresponding to readout RD1 is saturated, whereas a syndrome denoted S2 corresponding to readout RD2 is unsaturated. Therefore, approximation of the number of errors Ne based on the respective syndrome weight is valid for RD2 based on S2 but is invalid for RD1 based on S1. Methods for estimating the number of errors in RD1 even though its syndrome is saturated will be described in detail below.

A Scheme for Estimating the Number of Errors in Case of A Saturated Syndrome

Figure 3:
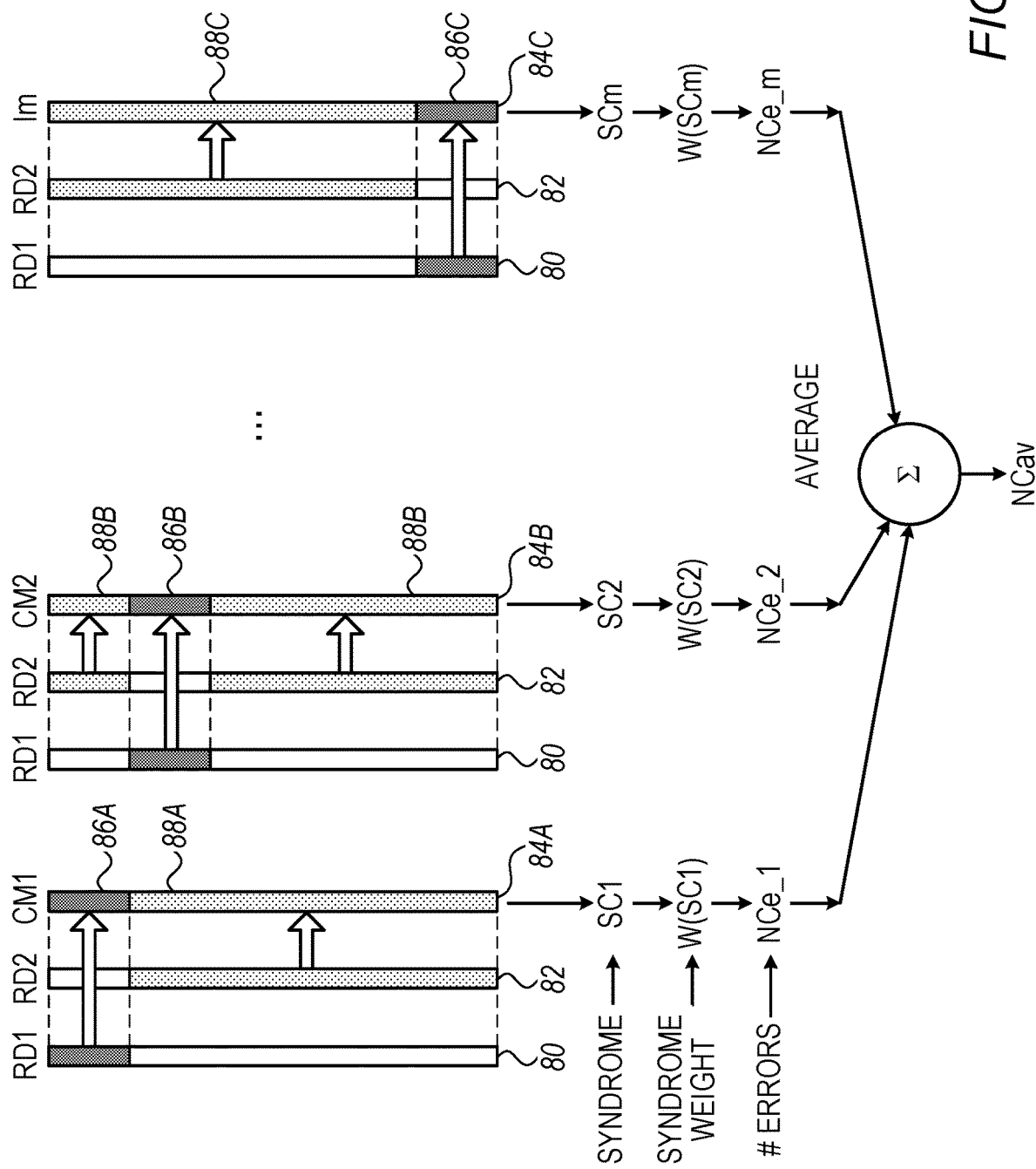
FIG. 3 is a diagram that schematically illustrates a scheme for estimating the number of errors in a readout of a code word having a saturated syndrome, in accordance with an embodiment that is described herein.

FIG. 3 is a diagram that schematically illustrates a scheme for estimating the number of errors in a readout of a code word having a saturated syndrome, in accordance with an embodiment that is described herein.

The scheme of FIG. 3 will be described as implemented by processor 48 of FIG. 1.

In FIG. 3, a readout RD1 80 has a saturated syndrome, and a readout RD2 82 has an unsaturated syndrome. Processor 48 may read RD1 and RD2 using read threshold TR1 and TR2 of FIG. 2.

Based on the readouts RD1 and RD2, processor 48 produces multiple vectors denoted CMi (i=1 . . . m) by combining in each CMi bits from both RD1 and RD2. In some embodiments, processor 48 produces a vector CMi by replacing some of the bits in RD2 with bits in the same bit-locations of RD1. In the example of FIG. 3, a vector CM1 84A comprises bits 86A from RD1 and bits 88A from RD2. Similarly, a vector CM2 84B comprises bits 86B from RD1 and bits 88B from RD2, and a vector CMm 84C comprises bits 86C from RD1 and bits 88C from RD2.

Processor 48 calculates syndromes denoted SCi i=1 . . . m, for the respective vectors CMi. In some embodiments, each vector CMi (i=1 . . . m) comprises m/N bits from RD1 and (N−m)/N bits from RD2. Let Ne1 denote the number of errors in RD1 and let Ne2 denote the number of errors in RD2. Since in the present example Ne2<Ne1, it is likely that the number of errors NCe_i in CMi satisfies Ne2<NCe_i<Ne1. Consequently, the syndrome SCi of CMi is likely to be unsaturated and therefore the number of errors NCe_i mapped from the syndrome weight W(SCi) of SCi is likely to be valid, and can be used instead of the invalid number of errors Ne1 or RD1.

Processor 48 may use the vectors CMi in various ways. In an embodiment, the processor calculates for each CMi a respective syndrome SCi and a syndrome weight W(SCi). The processor maps W(SCi) to the number of errors NCe_i, e.g., using Equation 3 or Equation 4 above. Processor 48 then improves the estimation accuracy by calculating an average number of errors denoted NCav given by:

$$NCav = \frac{1}{m}\sum_{i=1}^{m} NCe\_i \quad \text{Equation 5}$$

In some embodiments, the processor evaluates whether the syndrome SCi is saturated or not and excludes from the average calculation syndromes that were found to be saturated.

In the example of FIG. 3, the bits in CMi taken from RD1 form a contiguous bit-sequence in RD1. Moreover, the N bits of RD1 are divided into m disjoint subset of m/N bits. These limitations, however, are given by way of example and are not mandatory. For example, in some embodiments, the bit subsets taken from RD1 for producing CMi i=1 . . . m may overlap one another. As another example, instead of using predefined bit subsets from RD1, the bit subsets may be determined randomly across RD1.

The number m of vectors CMi may be selected using any suitable method. For example, when dividing RD1 into disjoint bit subsets, a large number m reduces the length N/m of each bit subset. This may decrease the probability of a saturated syndrome SCi, resulting in increasing the accuracy in estimating the number of errors in RD1.

In the example scheme of FIG. 3, processor 48 estimates an average number of errors NCav for RD1. In alternative embodiments, the processor attempts finding one unsaturated syndrome SCi and calculates the number of errors NCe_i from that syndrome.

In the example of FIG. 3, the processor averages among numbers of errors NCe_i. In alternative embodiments, the processor may calculate an average syndrome weight Wav over W(SCi) i=1 . . . m, and map Wav to NCav.

To demonstrate how the vector CMi may have an unsaturated syndrome even when RD1 has a saturated syndrome, assume that RD2 is produced using an optimal threshold voltage and has a number of errors E so that RD2 has an unsaturated syndrome. The number of errors in RD1 is therefore equals Ne1+N0−N1. When a vector CMi includes m/N bits from RD1 and (N−m)/N bits from RD2, the number of errors Nei in CMi is approximately Ne1+(N0−N1)/m. Therefore, CMi may have a lower number of errors than RD1 and may have an unsaturated syndrome. In this case, N0/m and N1/m may be estimated. For example, assuming m=8, the number of errors Nei in CMi is approximated by Nei=(7/8)Ne2+(1/8Ne1), wherein Nei of CMi and Ne2 are estimated from respective unsaturated syndromes. Based on Nei, Ne1 is thus given by Ne1=8Nei−7Ne2.

In another embodiment Ne1 in the example of m=8 can be calculated as an average given by Ne1=average(Ne1_i), wherein Ne1_i=8Nei−7Ne2, i=1 . . . 8. This is also equivalent to calculating Ne1=8NCav−7Ne2.

Methods for Estimating Number of Errors from a Saturated Syndrome

Figure 4:
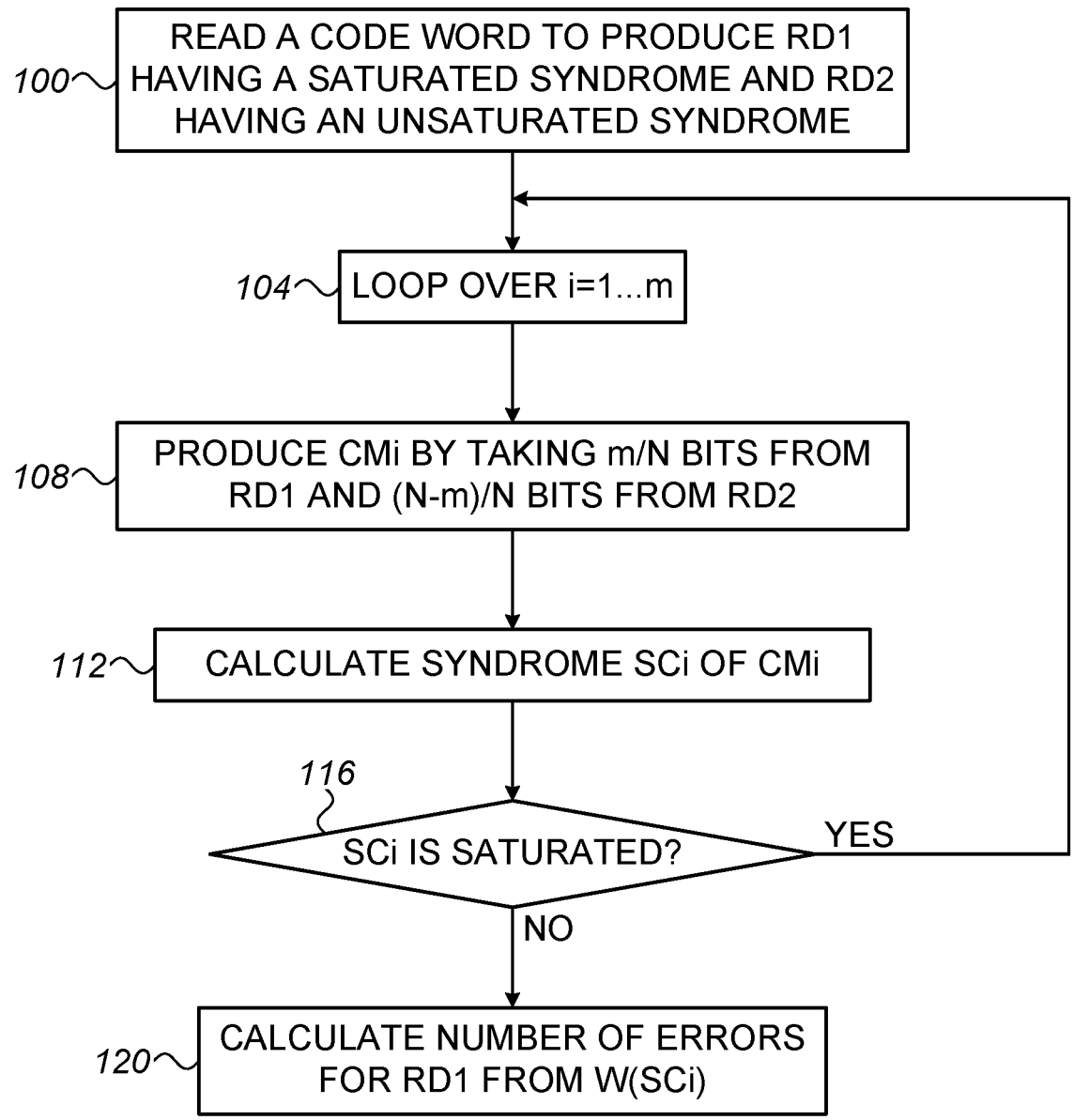
FIG. 4 is a flow chart that schematically illustrates a method for estimating number of errors in a code word readout having a saturated syndrome, in accordance with an embodiment that is described herein.

FIG. 4 is a flow chart that schematically illustrates a method for estimating number of errors in a code word readout having a saturated syndrome, in accordance with an embodiment that is described herein.

The method will be described as executed by processor 48 of memory controller 40.

The method begins at a reading step 100, with processor 48 reading a code word using read thresholds TR1 and TR2, from a same group of memory cells 32, which in this example resulting in respective readouts RD1 and RD2, wherein RD1 has a saturated syndrome and RD2 has an unsaturated syndrome. At a loop management step 104, the processor handles a loop over an index "i" in the range i=1 . . . m, wherein 1<m is a predefined integer. A tradeoff in selecting m is described above.

At a combined vector generation step 108, processor 48 produces a combined vector CMi that comprises m/N bits from RD1 and (N−m)/N bits from RD2. For example, the m/N bit subsets of RD1 across i=1 . . . m may be disjoint subsets.

At a syndrome calculation step 112, the processor calculates a syndrome SCi for the combined vector CMi. At a saturation checking step 116, the processor checks whether the syndrome SCi is saturated, and if so, loops back to step 104 to continue with the subsequent index value. Otherwise, the syndrome SCi is unsaturated, and processor 48 proceeds to a number of errors calculation step 120. At step 120, the processor calculates a number of errors Ne_i based on the syndrome weight W(SCi), e.g., using Equation 3 or 4 above. Since SCi is unsaturated, the estimation Ne_i is valid with high probability. Following step 120 the method terminates.

In the method of FIG. 3, it is assumed that at least one of the syndromes SCi i=1 . . . m has an unsaturated syndrome. In an embodiment, in case the syndromes SCi for all i=1 . . . m are saturated, no valid number of errors can be calculated for RD1 and the processor reports an error.

Methods for Improving Readout Performance

Figure 5:
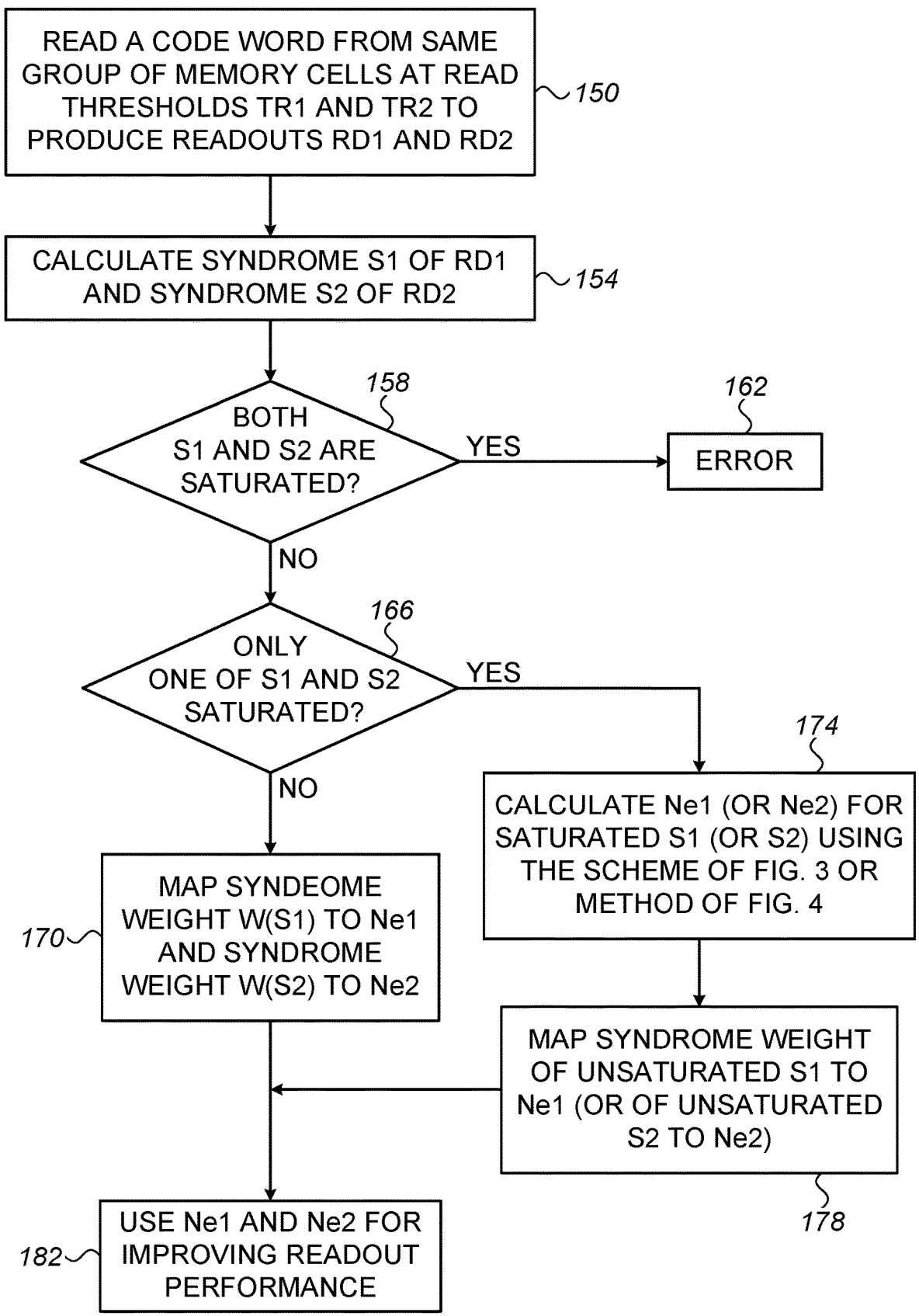
FIG. 5 is a flow chart that schematically illustrates a method for improving readout performance in a nonvolatile memory by estimating numbers of errors in two different readouts of the same code word, in accordance with an embodiment that is described herein.

FIG. 5 is a flow chart that schematically illustrates a method for improving readout performance in a nonvolatile memory by estimating numbers of errors in two different readouts of the same code word, in accordance with an embodiment that is described herein.

The method begins at a reading step 150, with processor 48 reading a code word from a group of memory cells 32 using two different read thresholds TR1 and TR2, which result in respective readouts RD1 and RD2. At a syndrome calculation step 154, the processor calculates a syndrome S1 for RD1 and a syndrome S2 for RD2.

At a saturation query step 158, processor 48 checks whether both syndromes S1 and S2 are saturated, and if so, proceeds to an error reporting step 162 to report an error. Otherwise, processor 48 checks, at a single saturation query step 166, whether only one of the syndromes S1 and S2 is saturated and the other is unsaturated. When at step 166 both S1 and S2 are found unsaturated the processor proceeds to a number of errors approximation step 170.

At step 170, since the syndromes are unsaturated, approximating the number of errors is likely to be valid, and the processor approximates the number of errors Ne1 in RD1 and Ne2 in RD2 by mapping the syndrome weight W(S1) to Ne1 and the syndrome weight W(S2) to Ne2, e.g., using Equation 3 or 4 above. Otherwise, at saturation step 174, the processor calculates for the saturated syndrome S1 or S2 a number of errors Ne1 or Ne2, e.g., using the scheme of FIG. 3 or the method of FIG. 4. At a mapping step 178, the processor maps syndrome weight W(S1) or W(S2) of unsaturated S1 or S2 to a respective number of errors Ne1 or Ne2.

Following step 170 or 178 the processor proceeds to a readout performance improvement step 182. At step 182 processor 82 may apply any suitable method for improving the readout performance. In one embodiment, processor 48 may retrieve three readouts RD1, RD2 and RD3 of a code word from the same group of memory cells using respective read thresholds TR1, TR2 and TR3, wherein at least one of the three readouts has an unsaturated syndrome. In an embodiment, the processor estimates (using the disclosed embodiments) the respective number of errors Ne1, Ne2 and Ne3 and determines an optimal read threshold, e.g., by finding a parabolic curve based on TR1, TR2, TR3, Ne1, Ne2 and Ne3, and positioning the optimal read threshold at the minimum of the parabolic curve. Alternatively, more than three read thresholds and more than three respective numbers of errors can also be used. In another embodiment, the processor tracks a channel matrix calculated based on at least N0 and N1 derived from Ne1 and Ne2 for a zone between the TR1 and TR2. The channel matrix contains conditional probabilities of falling in zones defined by the read thresholds and is indicative of the readout performance. In some embodiments, the processor evaluates from the channel matrix a readout performance metric, such as, for example, Signal to Noise Ratio (SNR) or mutual information. Based on the channel matrix or on a performance metric derived from the channel metric, the processor may modify the read thresholds configuration, the ECC configuration, or both. Methods for estimating a channel matrix are described, for example, in U.S. Pat. No. 10,388,394 cited above. In yet another embodiment, the processor decides whether to perform ECC decoding to RD2 for recovering an error-free version of the code word based on the values of Ne1 and Ne2. As will be described below, the processor may use Ne1 and Ne2 for calculating a LLR for a zone between TR1 and TR2 and perform soft decoding based on RD1, RD2 using that LLR.

Soft Decoding Based on a Code Word Readout Having A Saturated Syndrome

Figure 6:
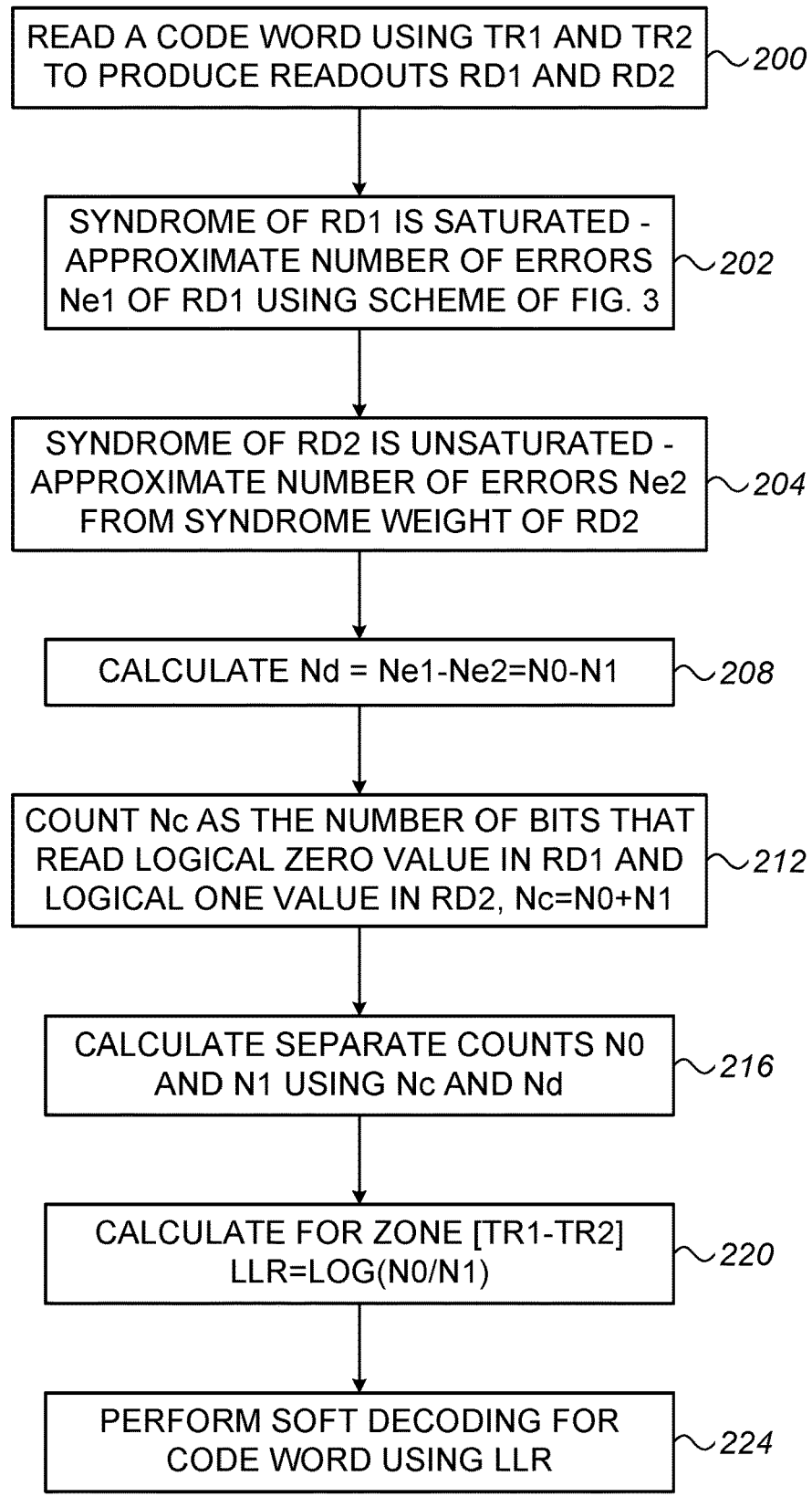
FIG. 6 is a flow chart that schematically illustrates a method for soft decoding based on a code word readout having a saturated syndrome, in accordance with an embodiment that is described herein.

FIG. 6 is a flow chart that schematically illustrates a method for soft decoding based on a code word readout having a saturated syndrome, in accordance with an embodiment that is described herein.

The method begins with processor 48 applying to a group of memory cells two read operations, using read thresholds TR1 and TR2, to produce respective readouts RD1 and RD2, at a reading step 200. In the present example, the syndrome of RD1 is assumed to be saturated and the syndrome of RD2 is assumed to be unsaturated.

At a first number of errors estimation step 202, processor 48 approximates the number of errors Ne1 in RD1 (whose syndrome is saturated) using, for example, the scheme of FIG. 3 above. At a second number of errors estimation step 204, the processor approximates the number of errors Ne2 in RD2 from the syndrome weight of RD2.

At a difference calculation step 208, the processor calculates the difference between Ne1 and Ne2 as:

$$Nd = Ne1 - Ne2 = N0 - N1 \qquad \text{Equation 6:}$$

At a sum calculation step 212, the processor counts a number Nc of bits that read logical zero-value in RD1 and a logical one-value in RD2, Nc is given in Equation 1 above as Nc=N0+N1.

At a separate counting step 216, processor 48 calculates separate values of N0 and N1 from the sum Nc and difference Nd of Equations 1 and 6.

At a log likelihood calculation step 220, processor 48 calculates, based on N0 and N1, a LLR for the zone between TR1 and TR2:

$$LLR = \log\left(\frac{N0}{N1}\right) \qquad \text{Equation 7}$$

At a soft decoding step 224, processor 48 applies to the code word in RD2 soft decoding using ECC module 50 using the LLR value of equation 7, and the method terminates.

In some embodiments, to improve soft decoding performance, the processor reads the same code word using multiple different read thresholds TR1 . . . TRk, k>2 to produce respective readouts RD1 . . . RDk. Assuming, for example, that the syndrome of RD1 is unsaturated and that the syndromes of RD2 . . . RDk are saturated, the processor calculates LLR(i) for the zones [TR1-Tri], i=2 . . . k, and use one or more of the calculated LLR(i) values for soft decoding.

The embodiments described above are given by way of example, and other suitable embodiments can also be used.

For example, the embodiments that were describe above focus mainly on two threshold voltage distributions, e.g., such as in storing 2 bits per cell in two programming levels. The disclosed embodiments are applicable, however, to memory devices that store more than 2 bits/cell in more than two programming levels. In such embodiments, processor 48 reads a page of a given bit significance value using one or more read thresholds and identifies the memory cells of two adjacent programming levels. The processor applies one or more of the embodiments described above for the corresponding two threshold voltage distributions.

In the embodiments above, the processor calculates an average number of readout errors in multiple combined readouts. In alternative embodiments, the processor may average other values. In an example embodiment, the processor calculates an average syndrome weight by averaging over multiple syndrome weights corresponding to multiple combined readouts and mapping the average syndrome weight to a respective number of errors. In other embodiments, the processor may average over multiple N0 and N1 values or LLR values calculated from multiple different combined readouts. In some embodiments, the processor may attempt various averaging methods, e.g., as described above, and select a method that results in best readout performance among these methods.

Although the embodiments described herein mainly address estimating the number of errors in a memory readout having a saturated syndrome, the methods and systems described herein can also be used in other applications, such as in communication systems. In this case, analog valued symbols are sampled and converted to multi-bit digital values using an Analog to Digital Converter (ADC). Selected analog ranges used for quantizing the bits to discrete values may be used for producing multiple readouts, analogously to the read thresholds in reading the memory.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A controller, comprising:
   an interface coupled to a nonvolatile memory device comprising multiple memory cells; and
   storage circuitry, configured to:
   store a code word produced with an Error Correction Code (ECC), in a group of the memory cells, by setting the memory cells in the group to analog levels representative of respective storage values;
   read the code word from the group of the memory cells, by comparing the analog levels of the memory cells to first and second read thresholds to produce respective first and second readouts;
   check whether approximating each of first and second numbers of errors in the first and second readouts, based on calculating respective first and second syndrome weights, is valid or not;
   in response to determining that approximation of the first number of errors is invalid, but that the approximation of the second number of errors is valid, produce a combined readout by replacing a portion of the bits in the second readout with corresponding bits of the first readout;
   calculate an enhanced syndrome weight for the combined readout and estimate the first number of errors based on the enhanced syndrome weight; and
   improve readout performance from at least the group of the memory cells using at least one of the estimated first number of errors and the second number of errors.

2. The controller according to claim 1, wherein the storage circuitry is configured to check whether an estimation of the first number of errors based on the combined readout is valid or not, and in response to determining that the estimation is invalid, to produce another combined readout by replacing another portion of the bits in the second readout with corresponding bits of the first readout, calculating another enhanced syndrome weight for the another combined readout and estimating the first number of errors based on the another enhanced syndrome weight.

3. The controller according to claim 1, wherein the storage circuitry is configured to produce multiple combined readouts by replacing respective portions of the bits in the second readout with corresponding bits of the first readout, calculating multiple respective enhanced syndrome weights for the combined readouts, and estimating the first number of errors based on the multiple enhanced syndrome weights.

4. The controller according to claim 3, wherein the storage circuitry is configured to calculate multiple numbers of errors from the multiple enhanced syndrome weights, and to calculate the first number of errors by calculating an average number of errors among the multiple numbers of errors.

5. The controller according to claim 1, wherein the storage circuitry is configured to calculate, based on the estimated first number of errors and on the second number of errors, a number N0 of bits having a logical zero-value and a number N1 of bits having a logical one-value in a range of threshold voltages between the first and second read thresholds, and to improve the readout performance based on the calculated values of N0 and N1.

6. The controller according to claim 5, wherein the storage circuitry is configured to improve the readout performance by calculating a Log Likelihood Ratio (LLR) as LLR=Log (N0/N1), and applying soft decoding to the code word based on the first and second readouts by assigning the calculated LLR to memory cells sensed between the first and second read thresholds.

7. The controller according to claim 5, wherein the storage circuitry is configured to improve the readout performance by tracking a channel matrix calculated based on at least N0 and N1 for a zone between the first and second read thresholds.

8. The controller according to claim 1, wherein the storage circuitry is configured to improve the readout performance by positioning an optimal read threshold based on three or more readouts in respective three or more different read thresholds, the readouts contain respective three or more numbers of errors, including the first and second read thresholds, and the first and second numbers of errors.

9. The controller according to claim 1, wherein the storage circuitry is configured to improve the readout performance by deciding whether to decode the code word, and in case of decoding, to further decide whether to decode the code word using hard decoding or soft decoding.

10. The controller according to claim 1, wherein the storage circuitry is configured to calculate the approximation of the first number of errors by mapping a syndrome weight of the first readout to the approximation of the first number of errors, and to decide that the approximation of the first number of errors is invalid when the approximation of the first number of errors exceeds a predefined threshold number.

11. A method for data storage, comprising:
in a controller coupled to a nonvolatile memory device comprising multiple memory cells, storing a code word produced with an Error Correction Code (ECC), in a group of the memory cells, by setting the memory cells in the group to analog levels representative of respective storage values;
reading the code word from the group of the memory cells, by comparing the analog levels of the memory cells to first and second read thresholds to produce respective first and second readouts;
checking whether approximating each of first and second numbers of errors in the first and second readouts, based on calculating respective first and second syndrome weights, is valid or not;
in response to determining that approximation of the first number of errors is invalid, but that the approximation of the second number of errors is valid, producing a combined readout by replacing a portion of the bits in the second readout with corresponding bits of the first readout;
calculating an enhanced syndrome weight for the combined readout and estimating the first number of errors based on the enhanced syndrome weight; and
improving readout performance from at least the group of the memory cells using at least one of the estimated first number of errors and the second number of errors.

12. The method according to claim 11, and comprising checking whether an estimation of the first number of errors based on the combined readout is valid or not, and in response to determining that the estimation is invalid, producing another combined readout by replacing another portion of the bits in the second readout with corresponding bits of the first readout, calculating another enhanced syndrome weight for the another combined readout and estimating the first number of errors based on the another enhanced syndrome weight.

13. The method according to claim 11, and comprising producing multiple combined readouts by replacing respective portions of the bits in the second readout with corresponding bits of the first readout, calculating multiple respective enhanced syndrome weights for the combined readouts, and estimating the first number of errors based on the multiple enhanced syndrome weights.

14. The method according to claim 13, wherein estimating the first number of errors comprises calculating multiple numbers of errors from the multiple enhanced syndrome weights, and calculating an average number of errors among the multiple numbers of errors.

15. The method according to claim 11, wherein improving the readout performance comprises calculating, based on the estimated first number of errors and on the second number of errors, a number N0 of bits having a logical zero-value and a number N1 of bits having a logical one-value in a range of threshold voltages between the first and second read thresholds, and improving the readout performance based on the calculated values of N0 and N1.

16. The method according to claim 15, improving the readout performance comprises calculating a Log Likelihood Ratio (LLR) as LLR=Log(N0/N1), and applying soft decoding to the code word based on the first and second readouts by assigning the calculated LLR to memory cells sensed between the first and second read thresholds.

17. The method according to claim 15, wherein improving the readout performance comprises tracking a channel matrix calculated based on at least N0 and N1 for a zone between the first and second read thresholds.

18. The method according to claim 11, wherein improving the readout performance comprises positioning an optimal read threshold based on three or more readouts in respective three or more different read thresholds, the readouts contain respective three or more numbers of errors, including the first and second read thresholds, and the first and second numbers of errors.

19. The method according to claim 11, wherein improving the readout performance comprises deciding whether to decode the code word, and in case of decoding, further deciding whether to decode the code word using hard decoding or soft decoding.

20. The method according to claim 11, and comprising calculating the approximation of the first number of errors by mapping a syndrome weight of the first readout to the first number of errors, and deciding that the approximation of the first number of errors is invalid when the approximation of the first number of errors exceeds a predefined threshold number.

* * * * *